United States Patent
Haba et al.

(10) Patent No.: US 10,600,760 B2
(45) Date of Patent: Mar. 24, 2020

(54) ULTRATHIN LAYER FOR FORMING A CAPACITIVE INTERFACE BETWEEN JOINED INTEGRATED CIRCUIT COMPONENT

(71) Applicant: Invensas Corporation, San Jose, CA (US)

(72) Inventors: Belgacem Haba, Saratoga, CA (US); Arkalgud R. Sitaram, Cupertino, CA (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 16/020,654

(22) Filed: Jun. 27, 2018

(65) Prior Publication Data

US 2018/0366446 A1    Dec. 20, 2018

Related U.S. Application Data

(62) Division of application No. 15/247,705, filed on Aug. 25, 2016, now Pat. No. 10,032,751.

(Continued)

(51) Int. Cl.
*H01L 25/065* (2006.01)
*H01L 23/64* (2006.01)
(Continued)

(52) U.S. Cl.
CPC ...... *H01L 25/0657* (2013.01); *H01L 21/0228* (2013.01); *H01L 21/02164* (2013.01);
(Continued)

(58) Field of Classification Search
CPC . H01L 25/043; H01L 25/0657; H01L 25/074; H01L 25/0756; H01L 25/117
See application file for complete search history.

(56) References Cited

U.S. PATENT DOCUMENTS 7,335,995 B2   2/2008 Pflughaupt et al.
7,462,935 B2   12/2008 Neaves
(Continued)

FOREIGN PATENT DOCUMENTS

KR   10-2008-0046020 A   5/2008
WO   1997-24740 A1   7/1997
WO   2014-184988 A1   11/2014

OTHER PUBLICATIONS

International Search Report and Written Opinion, dated Nov. 18, 2016 in PCT Application No. PCT/US2016/048889, 10 pages.
(Continued)

*Primary Examiner* — Tucker J Wright
*Assistant Examiner* — Wilner Jean Baptiste

(57) ABSTRACT

Capacitive coupling of integrated circuit die components and other conductive areas is provided. Each component to be coupled has a surface that includes at least one conductive area, such as a metal pad or plate. An ultrathin layer of dielectric is formed on at least one surface to be coupled. When the two components, e.g., one from each die, are permanently contacted together, the ultrathin layer of dielectric remains between the two surfaces, forming a capacitor or capacitive interface between the conductive areas of each respective component. The ultrathin layer of dielectric may be composed of multiple layers of various dielectrics, but in one implementation, the overall thickness is less than approximately 50 nanometers. The capacitance per unit area of the capacitive interface formed depends on the particular dielectric constants κ of the dielectric materials employed in the ultrathin layer and their respective thicknesses. Electrical and grounding connections can be made at the edge of the coupled stack.

20 Claims, 6 Drawing Sheets

Related U.S. Application Data

(60) Provisional application No. 62/234,022, filed on Sep. 28, 2015.

(51) Int. Cl.
| | |
|---|---|
| *H01L 23/48* | (2006.01) |
| *H01L 21/02* | (2006.01) |
| *H01L 21/311* | (2006.01) |
| *H01L 25/00* | (2006.01) |
| *H01L 23/00* | (2006.01) |

(52) U.S. Cl.
CPC .. *H01L 21/02181* (2013.01); *H01L 21/31111* (2013.01); *H01L 23/48* (2013.01); *H01L 23/642* (2013.01); *H01L 25/50* (2013.01); *H01L 24/03* (2013.01); *H01L 24/27* (2013.01); *H01L 24/29* (2013.01); *H01L 24/32* (2013.01); *H01L 24/72* (2013.01); *H01L 24/80* (2013.01); *H01L 24/83* (2013.01); *H01L 2224/034* (2013.01); *H01L 2224/03602* (2013.01); *H01L 2224/03614* (2013.01); *H01L 2224/08121* (2013.01); *H01L 2224/08145* (2013.01); *H01L 2224/274* (2013.01); *H01L 2224/27452* (2013.01); *H01L 2224/27602* (2013.01); *H01L 2224/27614* (2013.01); *H01L 2224/2908* (2013.01); *H01L 2224/2919* (2013.01); *H01L 2224/29186* (2013.01); *H01L 2224/29187* (2013.01); *H01L 2224/32135* (2013.01); *H01L 2224/32145* (2013.01); *H01L 2224/80896* (2013.01); *H01L 2224/80901* (2013.01); *H01L 2224/83191* (2013.01); *H01L 2224/83193* (2013.01); *H01L 2224/83896* (2013.01); *H01L 2225/06531* (2013.01); *H01L 2924/01072* (2013.01); *H01L 2924/0534* (2013.01); *H01L 2924/05442* (2013.01); *H01L 2924/30105* (2013.01)

(56) References Cited

U.S. PATENT DOCUMENTS

| | | | |
|---|---|---|---|
| 7,535,105 B2 | 5/2009 | Voldman | |
| 7,596,842 B2 | 10/2009 | Andresakis et al. | |
| 8,310,061 B2 | 11/2012 | Chandrasekaran | |
| 8,680,652 B2 | 3/2014 | Kim et al. | |
| 9,318,471 B2 | 4/2016 | Kabe et al. | |
| 2003/0215982 A1* | 11/2003 | Shimizu | H01L 23/50 438/118 |
| 2005/0221581 A1* | 10/2005 | RamachandraRao | H01L 21/76885 438/455 |
| 2006/0234405 A1* | 10/2006 | Best | H01L 23/48 438/15 |
| 2008/0116584 A1* | 5/2008 | Sitaram | H01L 24/02 257/777 |
| 2011/0198736 A1 | 8/2011 | Shero et al. | |
| 2013/0082352 A1 | 4/2013 | Kim et al. | |
| 2013/0127055 A1 | 5/2013 | Chen et al. | |
| 2013/0200528 A1* | 8/2013 | Lin | H01L 21/76877 257/774 |
| 2014/0117546 A1 | 5/2014 | Liu et al. | |
| 2014/0174927 A1 | 6/2014 | Bashir | |
| 2016/0043060 A1* | 2/2016 | Kabe | H01L 27/0688 257/774 |
| 2017/0092620 A1 | 3/2017 | Haba et al. | |
| 2018/0226371 A1 | 8/2018 | Enquist | |
| 2018/0240860 A1 | 8/2018 | Liu et al. | |

OTHER PUBLICATIONS

EP Search Report, dated Jun. 3, 2019, in Application No. 16852270.4, filed Aug. 26, 2016, 11 pages.

International Search Report and Written Opinion for PCT/US2019/048530, dated Dec. 16, 2019, 11 pages.

\* cited by examiner

ULTRATHIN LAYER FOR FORMING A CAPACITIVE INTERFACE BETWEEN JOINED INTEGRATED CIRCUIT COMPONENT

RELATED APPLICATIONS

This patent application is a divisional of U.S. patent application Ser. No. 15/247,705, filed Aug. 25, 2016, which claims the benefit of priority to U.S. Provisional Patent Application No. 62/234,022 to Haba et al., filed Sep. 28, 2015, both of which are incorporated herein by reference in their entirety.

BACKGROUND

Size reduction of wafer-level packages and microelectronic elements can sometimes be inhibited by the necessary inclusion of components that are difficult to miniaturize. For example, sometimes a package relies on the relatively large size of a discrete capacitor. If the package did not have to rely on the large component, the package could be made much smaller. In other instances, a certain value of capacitance is needed in an integrated circuit design and the construction process could be streamlined if the capacitor could be built into the wafer-level package design.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

This disclosure describes capacitive coupling of microelectronic components, such as integrated circuit dies, for example. Example techniques achieve a capacitive coupling with very fine pitch in a package construction. A very thin dielectric layer on the order of nanometers may be achieved between two conductive areas (plates or pads, i.e., one from each die) by joining two opposing surfaces. The two plates or pads are joined together to form a capacitor with separation, for example, under 50 nanometers.

In an example implementation, each component to be coupled has a surface that includes at least one conductive area, such as a metal pad or plate (i.e., capacitor plate). An ultrathin layer of dielectric is formed on at least one surface to be coupled. When the two components are permanently contacted together, the ultrathin layer of dielectric remains between the two surfaces, forming a capacitive interface between the conductive areas of each respective component. In an implementation, the ultrathin layer of dielectric may be composed of multiple layers of various dielectrics, but the combined thickness of such multiple layers is less than or equal to approximately 50 nanometers. The capacitance per unit area of the capacitive interface formed depends on the particular dielectric constants κ of the dielectric materials employed in the ultrathin layer, on the respective thicknesses of individual dielectric layers in the ultrathin layer (if more than one dielectric layer is used), and on the overall thickness of the combined ultrathin dielectric layer.

Electrical and grounding connections can be made at the edge of the coupled stack, i.e., around the edge of the capacitive interface. Thus, within the surface area of the capacitive interface, there may be no conductive connections, or very few conductive connections, that penetrate through the ultrathin layer of dielectric. If conductive connections are used within the surface area of the capacitive interface, such conductive connections are placed where there are no metal plates participating in the capacitive interface.

The example capacitive coupling techniques described herein provide numerous benefits, such as smaller-size wafer-level packages, savings in materials used, and potentially lower voltage requirements because of thinner dielectrics and relatively high dielectric constants κ per unit area. For certain applications, such as mobile devices that utilize small-size batteries, significantly lower operating voltages may be achieved.

Example Systems

Figure 1:
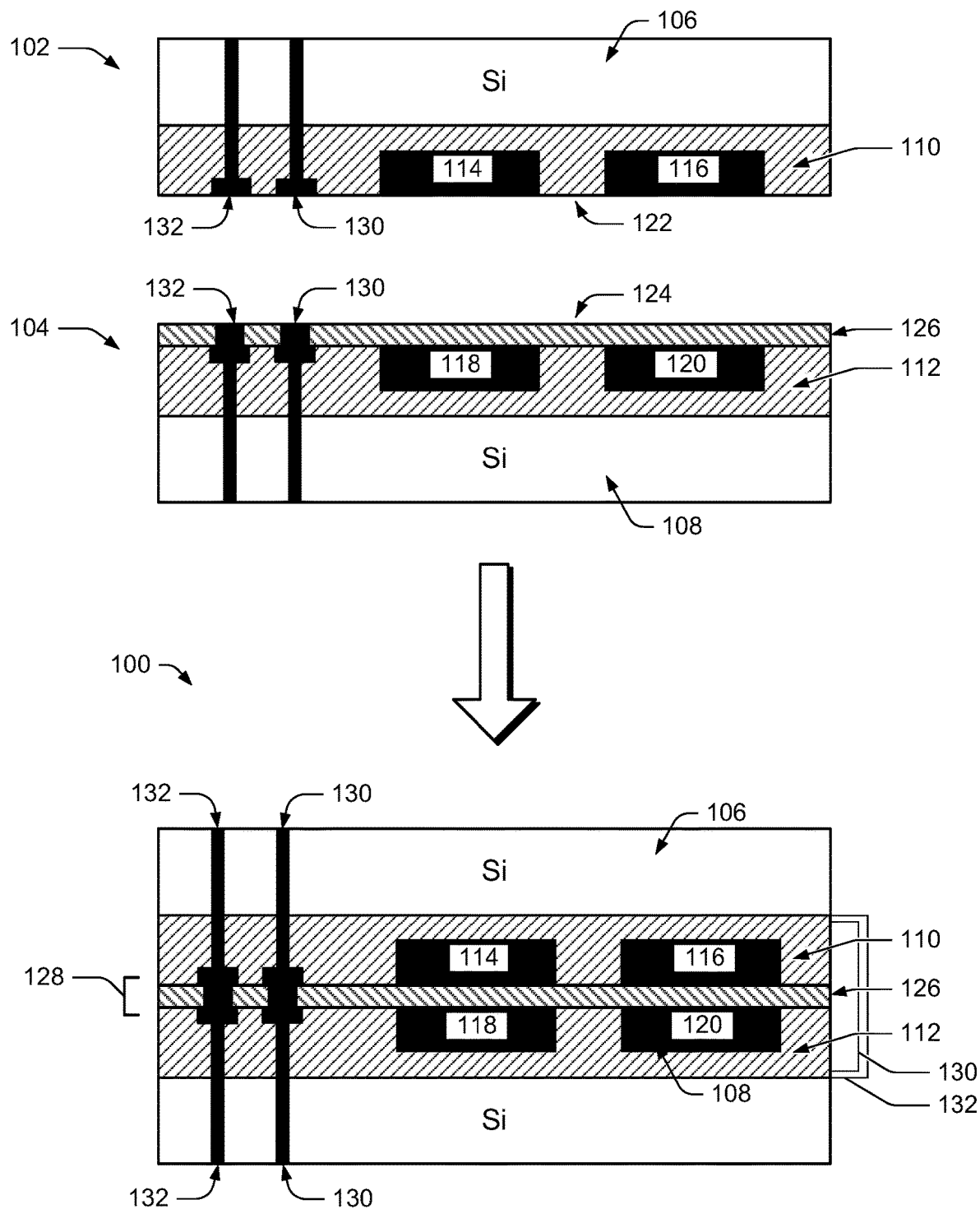
FIG. 1 is a diagram of an example wafer-level package construction 100 that includes an example capacitive coupling with an ultrathin dielectric layer.

FIG. 1 shows an example wafer-level package construction 100 that includes a first integrated circuit die 102 and a second integrated circuit die 104. Each integrated circuit die 102 & 104 has a semiconductor 106 & 108, such as silicon, and an underfill layer 110 & 112 composed of insulation or dielectric (for example, silicon dioxide) securing conductive areas 114 & 116 and 118 & 120. Each integrated circuit die 102 & 104 has a respective surface 122 & 124 that includes at least one of the conductive areas 114 & 116, or 118 & 120.

An ultrathin dielectric layer 126 that has a thickness less than or equal to approximately 50 nanometers is formed on at least one of the surfaces 122 or 124 of at least one of the integrated circuit dies 102 & 104. The ultrathin dielectric layer may be a coating, film, residue, membrane, deposit, and so forth. The coupled stack 100 forms a capacitive interface 128 that includes the ultrathin dielectric layer 126, and at least one pair of the respective conductive areas, e.g., 114 & 118 or 116 & 120 of the first and second integrated circuit dies 102 & 104, on opposing sides of the ultrathin dielectric layer 126.

The thickness of the ultrathin dielectric layer 126 can be in the range of approximately 2-50 nanometers. For example, the ultrathin dielectric layer 126 can be 5-6 nanometers thick. In an implementation, the ultrathin dielectric layer 126 is less than 2 nanometers thick.

In an implementation, the ultrathin dielectric layer 126 can be composed of silicon oxide (silicon dioxide $SiO_2$). Or, the ultrathin dielectric layer 126 can be composed of a dielectric such as silicon monoxide, silicon trioxide, aluminum oxide, hafnium oxide, a high-κ ionic metal oxide, a hybrid oxygen-plasma-grown metal oxide & alkylphosphonic acid self-assembled monolayer (SAM), a polymer film, or an ionic metal oxide membrane.

For example, the ultrathin dielectric layer 126 may be an atomic layer deposition of hafnium oxide with precise control of the thickness of the ultrathin dielectric layer 126 down to 1-2 nanometers.

In another example, the ultrathin dielectric layer 126 can be a layer of a metal oxide & alkylphosphonic acid self-assembled monolayer (SAM) that has a thickness of approximately 5-6 nanometers and a capacitance per unit area of approximately 500-800 $nF/cm^2$.

In an example, the two integrated circuit dies 102 & 104 may be coupled together in a stack by mechanically securing the two integrated circuit dies 102 & 104 together at an edge of the stack 100. In another example, the ultrathin dielectric layer 126 on at least one of the surfaces 122 & 124 of at least one of the integrated circuit dies 102 & 104 may have an adhesive quality for adhering the integrated circuit dies 102 & 104 to each other.

Electrical power connections 130 and electrical grounding connections 132 between the two integrated circuit dies 102 & 104 may be located at an edge of the stack 100. If conductive connections 130 & 132 are used within the surface area of the capacitive interface 128, such conductive connections 130 & 132 are placed where there are no metal plates 114 & 116 & 118 & 120 participating in the capacitive interface 128.

Figure 2:
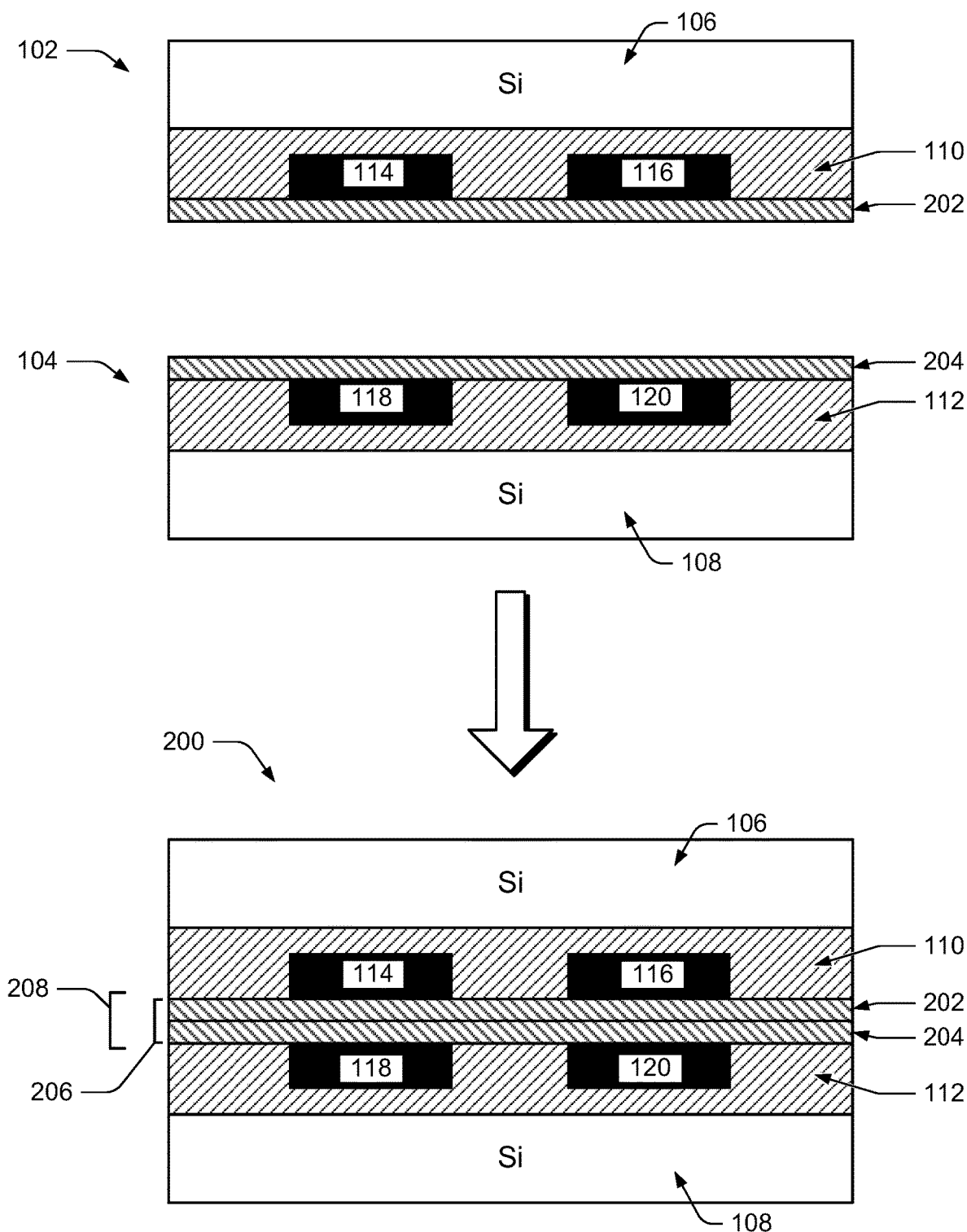
FIG. 2 is a diagram of an example wafer-level package construction in which the ultrathin dielectric layer includes two component dielectric layers.

FIG. 2 shows an example wafer-level package construction 200, in which the ultrathin dielectric layer 206 includes multiple component dielectric layers 202 & 204. In this example, a first component dielectric layer 202 is formed on one of the integrated circuit dies 102, and a second component dielectric layer 204 is formed on the other integrated circuit die 104. The multiple component dielectric layers 202 & 204 may be composed of the same dielectric material, such as silicon oxide, or different dielectric materials. In this example, each component dielectric layer 202 & 204 has a thickness of less than or equal to 25 nanometers. When the two integrated circuit dies 102 & 104 are coupled, the resulting overall ultrathin dielectric layer 206 has a thickness of less than or equal to approximately 50 nanometers. The capacitive interface 208 that is formed includes the ultrathin dielectric layer 206, and respective conductive areas 114 & 116 and 118 & 120 of the first and second integrated circuit dies 102 & 104, on opposing sides of the ultrathin dielectric layer 206.

Figure 3:
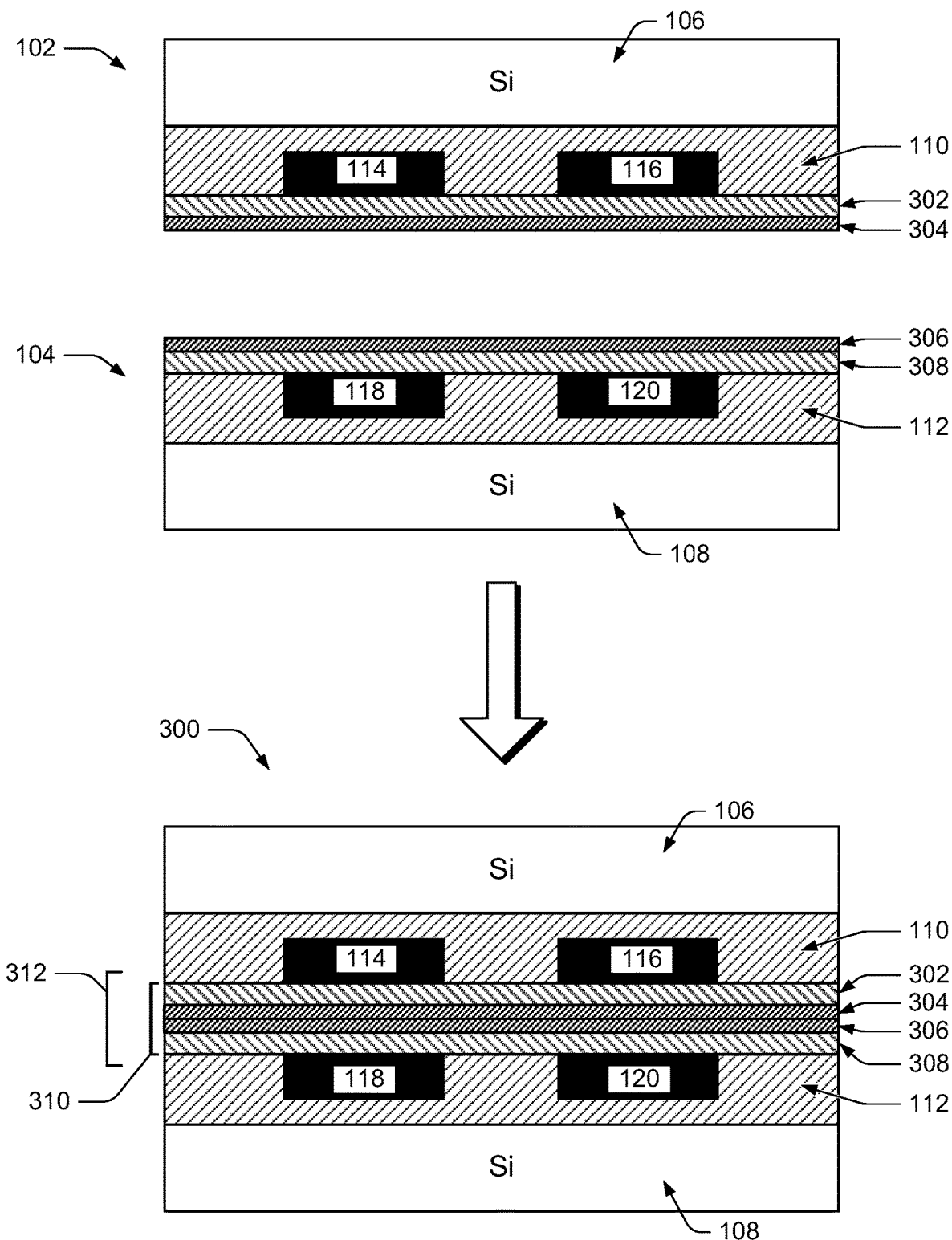
FIG. 3 is a diagram of another example wafer-level package construction in which the ultrathin dielectric layer includes multiple component dielectric layers.

FIG. 3 shows an example wafer-level package construction 300, in which the ultrathin dielectric layer 310 includes multiple component dielectric layers 302 & 304 and 306 & 308. In this example, a first set of component dielectric layers 302 & 304 is formed on one of the integrated circuit dies 102, and a second set of component dielectric layers 306 & 308 is formed on the other integrated circuit die 104. Each set of ultrathin dielectric layers 302 & 304 or 306 & 308 has a thickness of less than or equal to approximately 25 nanometers, for example. Or, when the two integrated circuit dies 102 & 104 are coupled, the resulting overall ultrathin dielectric layer 310 has a thickness of less than or equal to approximately 50 nanometers, for example. Symmetry in the thickness of the multiple layers is not needed. The capacitive interface 312 that is formed includes the ultrathin dielectric layers 302 & 304 and 306 & 308 and respective conductive areas 114 & 116 and 118 & 120 of the first and second integrated circuit dies 102 & 104, on opposing sides of the ultrathin dielectric layer 310.

When multiple layers of ultrathin dielectric materials are used for the different layers (e.g., 302 & 304 or 306 & 308) of an overall ultrathin dielectric layer 310, the multiple layers may be composed of different dielectric materials, such as one or more layers of silicon oxide, and one or more a layers of a high-κ dielectric other than silicon oxide, such as silicon monoxide, silicon trioxide, aluminum oxide, hafnium oxide, a high-κ ionic metal oxide, a hybrid oxygen-plasma-grown metal oxide & alkylphosphonic acid self-assembled monolayer (SAM), or a polymer, for example.

When multiple layers of ultrathin dielectric materials are used for the different layers (e.g., 302 & 304 or 306 & 308) of an overall ultrathin dielectric layer 310, the multiple layers may be asymmetrical with respect to a parallel central plane of the multiple layers. The asymmetry may consist of a difference in the number, arrangement, thicknesses, or composition of one or more of the multiple layers on either side of the parallel central plane of the multiple layers.

Figure 4:
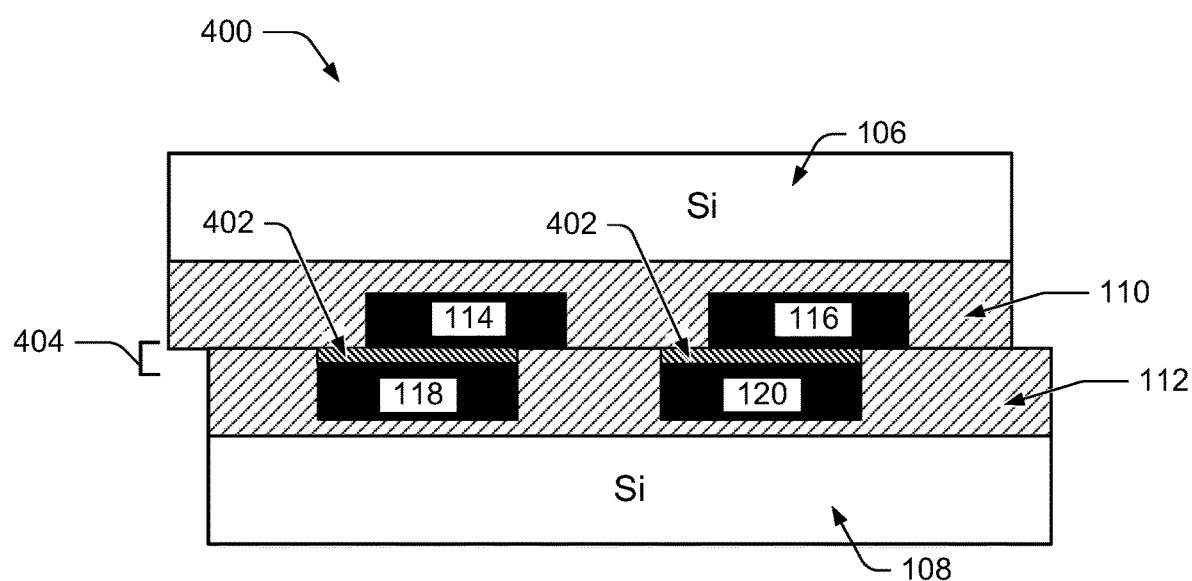
FIG. 4 is a diagram of an example wafer-level package including a capacitive interface with staggered conductive plates.

FIG. 4 shows an example embodiment of a wafer-level package 400 including a capacitive interface 404 with an ultrathin dielectric layer 402. As shown in FIG. 4, the respective conductive areas 114 & 116 and 118 & 120 of the first and second integrated circuit dies 102 & 104 do not have to align perfectly on opposing sides of the ultrathin dielectric layer 402 of the capacitive interface 404. The respective conductive areas 114 & 116 and 118 & 120 of the first and second integrated circuit dies 102 & 104 can be staggered with respect to each other, and the staggered alignment can be used to obtain a particular capacitance, for example, between a first conductive area 114 and a second conductive area 118 on opposing sides of the capacitive interface 404.

Figure 5:
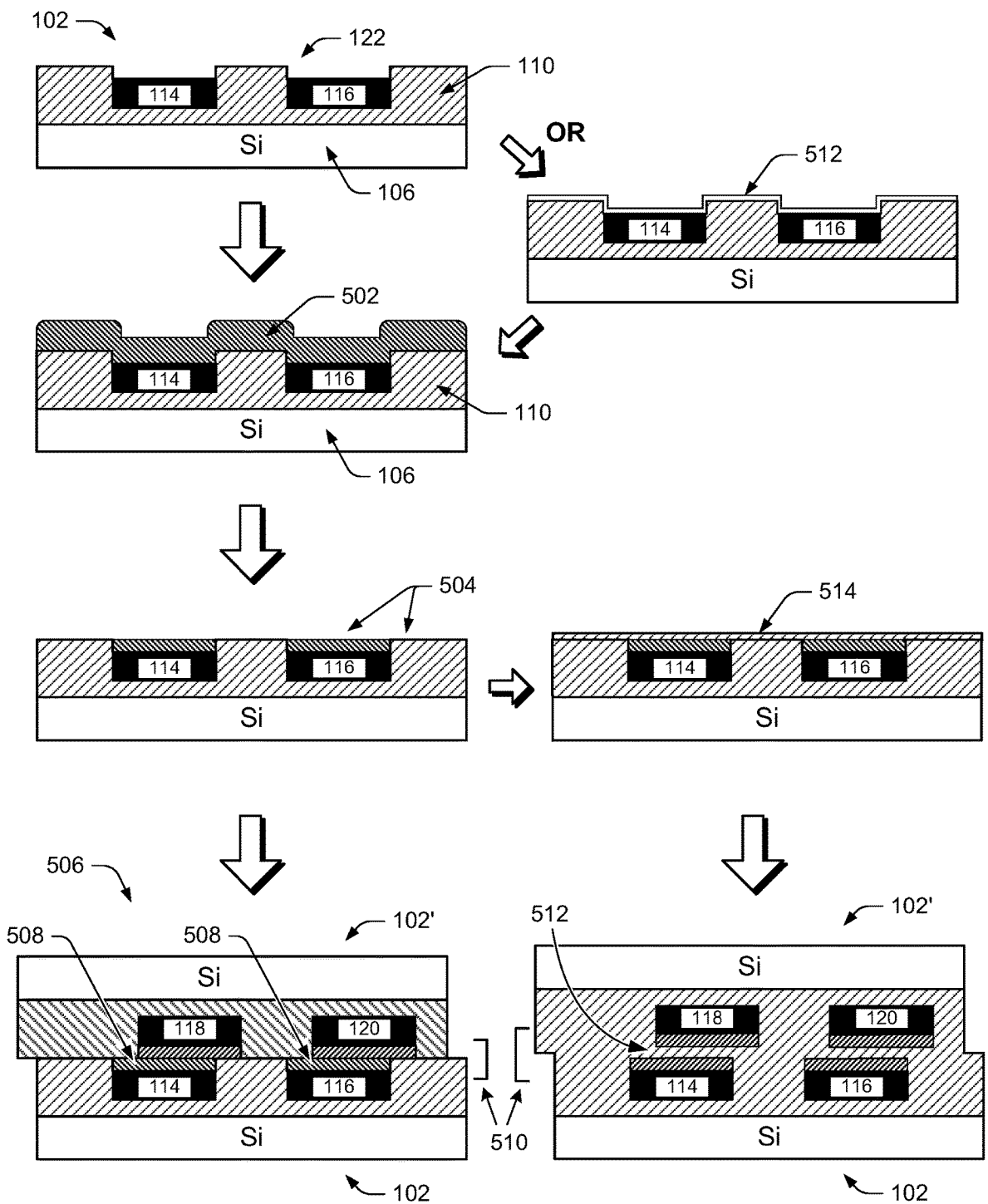
FIG. 5 is a diagram of an example process for making a coupled capacitive wafer-level package including a capacitive interface.

FIG. 5 shows an example process for making a coupled capacitive wafer-level package 500 including a capacitive interface 510. In an implementation, integrated circuit dies 102 & 102' have a semiconductor 106, such as silicon, and an underfill layer 110 composed of insulation or dielectric, such as silicon dioxide, securing one or more conductive areas 114 & 116. Each integrated circuit die 102 & 102' has a respective surface 122 that includes the conductive areas 114 & 116. The surface 122 does not have to be flat at this point in the process.

A layer of dielectric 502, such as silicon oxide or a high-κ dielectric, is formed over the surface 122, including the one or more conductive areas 114 & 116 and exposed parts of the underfill layer 110. In an implementation, the layer of dielectric 502 is ground, etched, lapped, or polished, (or deposited), etc., to a thickness less than or equal to approximately 50 nanometers. The thickness to be achieved for a given layer of the dielectric 502 may depend on how many layers are to compose the overall ultrathin dielectric layer 508, and the value of capacitance per unit area desired. The layer of dielectric 502 is etched or otherwise removed, for example, down to the exposed parts of the underfill layer 110, to form a flat surface 122.

Two instances of the same integrated circuit die 102 & 102', each now having a smooth flat surface 504, may now be coupled to form a stack 506. The capacitive interface 510 resulting from the coupling includes the ultrathin dielectric layer 508, and at least one pair of conductive areas 114 & 118 or 116 & 120, on opposing sides of the ultrathin dielectric layer 508.

In a variation, a layer of etch stop 512 or a lapping-polishing stop may be applied to the initial surface 122 to protect the underlying structures and assist formation of the ultrathin dielectric layer 508 at an ultrafine pitch. Thus, the etch stop 512 or lapping-polishing stop is deposited on the underlying structures, such as the exposed underfill 110 and the conductive areas 114 & 116, to protect the structures (110 & 114 & 116) underlying the etch stop layer 512 from damage caused by the etch process. The etch stop layer 512 terminates the etch process once the desired thickness of the ultrathin dielectric layer 508 has been achieved by the etch process.

The etch stop may be a silicon dioxide etch stop, a boron etch stop, an aluminum oxide etch stop, a polysilicon etch stop, a titanium oxide etch stop, or a silicon nitride etch stop.

The etch or lapping process may be a dry chemical etch process, a wet etch process, a gaseous etch process, for example, using oxide etch gases such as $CF_4$, $CHF_3$, $CH_2F_2$, $NF_3$, or $O_2$, or an electrochemical etch process, e.g., using electrochemical etch rate modulation. In an implementation, the ultrathin dielectric layer 508, or a component layer thereof, is formed by deposition, such as atomic layer deposition of a dielectric such as hafnium oxide ($HfO_2$).

A combination of an oxygen-plasma-grown metal oxide (e.g., aluminum oxide) and a high-quality alkylphosphonic acid self-assembled monolayer (SAM) can be obtained at process temperatures of no more than about 100° C., and can be formed not only on glass (silicon oxide) substrates, but also on commercially available flexible plastic substrates, such as polyethylene naphthalate or polyethylene terephthalate. Such an ultrathin dielectric layer 508 may have a total thickness of approximately 5-6 nanometers and a capacitance per unit area of approximately 500-800 $nF/cm^2$.

In a variation, after a smooth flat surface 504 has been obtained from etching the dielectric layer 502, an additional ultrathin dielectric layer 514, e.g., of silicon oxide or other high-k dielectric, may be formed above the smooth flat surface 504. The additional ultrathin dielectric layer 514 can be used to tune the thickness, and thus the capacitance, of the resulting capacitive interface 510, once the integrated circuit dies 102 & 102' have been coupled into a stack 506, forming the capacitive interface 510. The additional ultrathin dielectric layer 514 can also be used to increase the resistance of the capacitive interface 510 against charge and voltage leakage, or dielectric breakdown.

Example Methods

Figure 6:
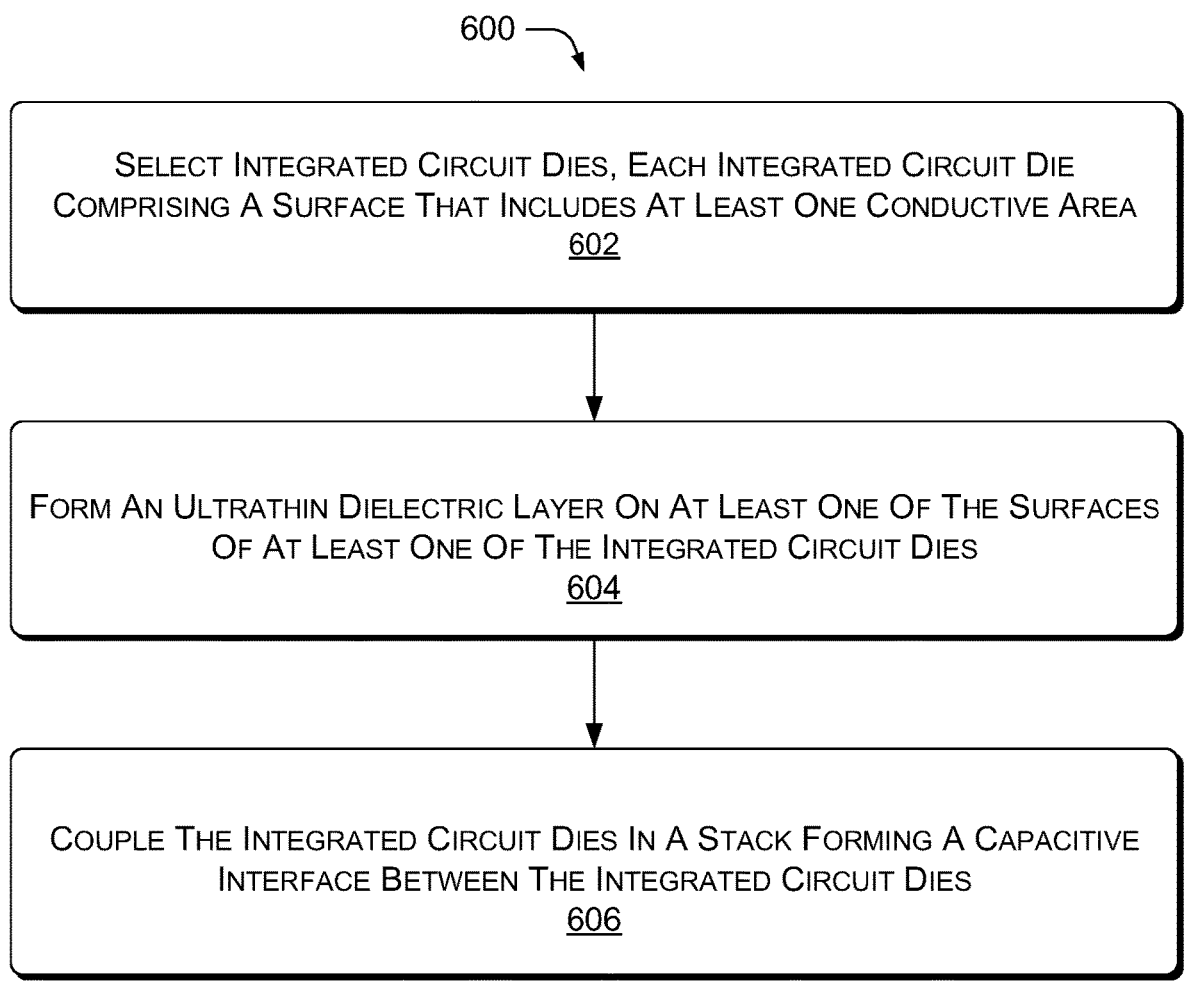
FIG. 6 is a flow diagram of an example method of coupling integrated circuit dies to form a capacitive interface.

FIG. 6 shows an example method 600 of coupling integrated circuit dies or other microelectronic components. In the flow diagram, the operations are shown as individual blocks.

At block 602, integrated circuit dies are selected, each integrated circuit die having a surface that includes at least one conductive area.

At block 604, an ultrathin layer of a dielectric is formed on at least one of the surfaces of at least one of the integrated circuit dies, including at least one of the conductive areas.

At block 606, the two integrated circuit dies are coupled together in a stack to form a capacitive interface composed of the ultrathin dielectric layer and the respective conductive areas of the two integrated circuit dies on opposing sides of the ultrathin layer of the dielectric.

While the present disclosure has been disclosed with respect to a limited number of embodiments, those skilled in the art, having the benefit of this disclosure, will appreciate numerous modifications and variations from the description provided herein. It is intended that the appended claims cover such modifications and variations as fall within the true spirit and scope of the disclosure.

The invention claimed is:

1. A wafer-level package, comprising:
   first and second integrated circuit dies, each integrated circuit die
   interfacing a single ultrathin layer of a first dielectric material between respective bonding surfaces of the first and second integrated circuit dies, each respective bonding surface partly comprising respective second dielectric layers of a second dielectric material;
   each integrated circuit die comprising at least one conductive pad recessed from each respective bonding surface, wherein the respective conductive pads of the first and second integrated circuit dies are on opposing sides of the single ultrathin layer of the first dielectric material;
   an instance of a third layer of a third dielectric material between each recessed conductive pad and each respective bonding surface of the first and second integrated circuit dies, each instance of the third layer of the third dielectric material filling-in respective recesses between the respective recessed conductive pads and the respective bonding surfaces;
   a total thickness of the single ultrathin layer of the first dielectric material and two respective instances of the third layer of the third dielectric material being 25 nanometers or less, wherein the total thickness also comprises a distance between the respective recessed conductive pads on opposing sides of the single ultrathin layer;
   a capacitive interface comprising the single ultrathin layer of the first dielectric material, the two respective instances of the third layer of the third dielectric material in the respective recesses, and the respective recessed conductive pads of the first and second integrated circuit dies;
   a conductive power connection between the first and second integrated circuit dies, the conductive power connection disposed only through the second layer of the second dielectric material and through the single ultrathin layer of the first dielectric material; and
   a conductive ground connection between the first and second integrated circuit dies, the conductive ground connection disposed only through the second layer of the second dielectric material and through the single ultrathin layer of the first dielectric material.

2. The wafer-level package of claim 1, wherein the first dielectric material is selected from the group consisting of silicon dioxide, silicon monoxide, silicon trioxide, aluminum oxide, hafnium oxide, a high-κ ionic metal oxide, a hybrid oxygen-plasma-grown metal oxide and alkylphosphonic acid self-assembled monolayer (SAM), a polymer film, and an ionic metal oxide membrane.

3. The wafer-level package of claim 1, wherein the single ultrathin layer of the first dielectric comprises a thickness less than 2 nanometers.

4. The wafer-level package of claim 3, wherein the single ultrathin layer of the first dielectric comprises an atomic layer deposition of hafnium oxide with a thickness of the single ultrathin layer around 1 nanometer.

5. The wafer-level package of claim 1, wherein the first dielectric material and the second dielectric material are different materials.

6. The wafer-level package of claim 1, wherein the second and third dielectric materials are the same dielectric material.

7. A microelectronics package, comprising:
   first and second dies, each die including a respective surface for making a joined electrical interface between the first and second dies;
   a signal pad recessed from at each of the respective surfaces, the signal pads comprising a circuit for capacitively passing a signal between the first and second dies across the joined electrical interface;

an ultrathin layer of a first dielectric between the respective surfaces of the first and second dies;

a second dielectric in each recess of each signal pad recessed from a respective surface for making the joined electrical interface;

the ultrathin layer of the first dielectric, the respective signal pad of each die, and the second dielectric in each recess of each signal pad comprising a capacitive coupling of the circuit for passing the signal across the joined electrical interface;

a first conductive pad at each of the respective surfaces for making a conductive power connection through the ultrathin layer of the first dielectric between the first and second dies;

a second conductive pad at each of the respective surfaces for making a conductive ground connection through the ultrathin layer of the first dielectric between the first and second dies; and wherein an overall thickness of the ultrathin layer of the first dielectric and two instances of the second dielectric in each of two recesses of the respective signal pads comprises 25 nanometers or less.

8. The microelectronics package of claim 7, wherein the first conductive pads for power on opposing sides of the joined electrical interface are conductively connected to each other exclusive of the second dielectric, through the ultrathin layer with a metal-to-metal conductive connection;

wherein the second conductive pads for ground on opposing sides of the joined electrical interface are conductively connected to each other exclusive of the second dielectric, through the ultrathin layer with a metal-to-metal conductive connection; and wherein the signal pads on opposing sides of the joined electrical interface are capacitively coupled with each other with intervention of the ultrathin layer of the first dielectric and respective instances of the second dielectric between the signal pads on the opposing sides.

9. The microelectronics package of claim 7, wherein a first area of the joined electrical interface has power pads coupled directly together across the joined electrical interface and has ground pads coupled directly together across the joined electrical interface, and a second area of the joined electrical interface has the signal pads capacitively coupled across the joined electrical interface with the ultrathin layer of the first dielectric and the respective instances of the second dielectric intervening between the capacitively coupled signal pads.

10. The microelectronics package of claim 7, further comprising multiple first conductive pads on each surface for multiple power connections between the first and second dies.

11. The microelectronics package of claim 7, further comprising multiple second conductive pads on each surface for multiple ground connections between the first and second dies.

12. The microelectronics package of claim 7, further comprising multiple signal pads recessed from each respective surface of the first and second dies, each signal pad on a side of the joined electrical interface corresponding with a respective signal pad on the opposing side of the joined electrical interface, the respective multiple signal pads of each surface separated by the ultrathin layer of the first dielectric and the respective instances of the second dielectric, the multiple signal pads comprising multiple circuits for passing a same signal across the joined electrical interface.

13. The microelectronics package of claim 7, further comprising multiple signal pads recessed from each respective surface of the first and second dies, each signal pad on a side of the joined electrical interface corresponding with a respective signal pad on the opposing side of the joined electrical interface, the respective multiple signal pads of each surface separated by the ultrathin layer of the first dielectric and the respective instances of the second dielectric, the multiple signal pads for providing multiple circuits for passing multiple different signals across the joined electrical interface in respective multiple different circuits.

14. The microelectronics package of claim 13, wherein corresponding signal pads on opposing sides of the joined electrical interface are staggered to provide a given capacitance of the capacitive couplings.

15. The microelectronics package of claim 7, further comprising multiple signal pads on each respective surface of the first and second dies, each signal pad on a side of the joined electrical interface corresponding with a respective signal pad on the opposing side of the joined electrical interface, each pair of signal pads on opposing sides of the joined electrical interface separated by a separate instance of the ultrathin layer of the first dielectric and the respective instances of the second dielectric.

16. The microelectronics package of claim 7, wherein the ultrathin layer of the first dielectric comprises a thickness less than 2 nanometers.

17. The microelectronics package of claim 7, wherein the ultrathin layer of the first dielectric comprises one of a coating, a film, a residue, a membrane, or a deposit; and wherein a thickness and a dielectric constant of the ultrathin layer of the first dielectric determines a capacitance of the capacitive coupling.

18. The microelectronics package of claim 7, wherein the ultrathin layer of the first dielectric itself comprises multiple layers.

19. The microelectronics package of claim 7, wherein the respective surfaces for making the joined electrical interface and the capacitive coupling are each direct bonded to the ultrathin layer.

20. The microelectronics package of claim 7, wherein at least one of the respective surfaces for making the joined electrical interface has a coplanar bonding surface comprising the ultrathin layer, a surface of the first conductor through the ultrathin layer, and a surface of the second conductor through the ultrathin layer; and wherein the coplanar bonding surface is direct hybrid bonded to the other respective surface to make the capacitive coupling, the conductive power connection, and the conductive ground connection.

* * * * *